(12) United States Patent
Koge et al.

(10) Patent No.: US 11,350,514 B2
(45) Date of Patent: May 31, 2022

(54) EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventors: Koichiro Koge, Oyama (JP); Atsushi Ueda, Oyama (JP); Takayuki Osanai, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/160,486

(22) Filed: Jan. 28, 2021

(65) Prior Publication Data

US 2021/0307150 A1    Sep. 30, 2021

(30) Foreign Application Priority Data

Mar. 24, 2020   (JP) .............................. JP2020-053145

(51) Int. Cl.
*H05G 2/00* (2006.01)
*G03F 7/20* (2006.01)

(52) U.S. Cl.
CPC ......... *H05G 2/006* (2013.01); *G03F 7/70025* (2013.01); *G03F 7/70033* (2013.01); *H05G 2/008* (2013.01)

(58) Field of Classification Search
CPC .... H05G 2/006; H05G 2/008; G03F 7/70025; G03F 7/70033
See application file for complete search history.

(56) References Cited

U.S. PATENT DOCUMENTS

| | | |
|---|---|---|
| 2006/0219959 A1 | 10/2006 | Hergenhan et al. |
| 2009/0090877 A1 | 4/2009 | Van Empel et al. |
| 2013/0126761 A1 | 5/2013 | Nagai et al. |
| 2020/0241425 A1 | 7/2020 | Ueda |

FOREIGN PATENT DOCUMENTS

| | | |
|---|---|---|
| CN | 103108481 A | 5/2013 |
| WO | 2018/127565 A2 | 7/2018 |
| WO | 2019/102526 A1 | 5/2019 |

OTHER PUBLICATIONS

A Search Report issued by the Netherlands Patent Office dated Jan. 31, 2022, which corresponds to Dutch Patent Application No. 2027481 and is related to U.S. Appl. No. 17/160,486; with partial English language explanation.

*Primary Examiner* — Nicole M Ippolito
*Assistant Examiner* — Hanway Chang
(74) *Attorney, Agent, or Firm* — Studebaker & Brackett PC

(57) ABSTRACT

An extreme ultraviolet light generation apparatus includes a chamber device, a concentrating mirror, an exhaust port, and a central gas supply port. The exhaust port is formed at the chamber device and is formed on the side lateral to a focal line and opposite to the reflection surface with respect to the plasma generation region. The central gas supply port is formed on the side opposite to the exhaust port with respect to the plasma generation region on the supply line passing through the exhaust port, the plasma generation region, and an inner side of a peripheral portion of the reflection surface. The central gas supply port supplies the gas toward the exhaust port along the supply line through the plasma generation region.

14 Claims, 13 Drawing Sheets

EXTREME ULTRAVIOLET LIGHT GENERATION APPARATUS, AND ELECTRONIC DEVICE MANUFACTURING METHOD

CROSS-REFERENCE TO RELATED APPLICATIONS

The present application claims the benefit of Japanese Patent Application No. 2020-053145, filed on Mar. 24, 2020, the entire contents of which are hereby incorporated by reference.

BACKGROUND

1. Technical Field

The present disclosure relates to an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As an EUV light generation apparatus, a laser produced plasma (LPP) type apparatus in which plasma generated by irradiating a target substance with laser light is used has been developed.

LIST OF DOCUMENTS

Patent Documents

Patent Document 1: US Patent Application Publication No. 2013/0126761
Patent Document 2: US Patent Application Publication No. 2006/0219959
Patent Document 3: International Publication No. WO 2018/127565
Patent Document 4: International Publication No. WO 2019/102526

SUMMARY

An extreme ultraviolet light generation apparatus according to an aspect of the present disclosure includes a chamber device including a plasma generation region, at an internal space thereof, in which plasma is generated from a droplet to which laser light is radiated; a concentrating mirror disposed in the internal space as including a spheroidal reflection surface configured to reflect extreme ultraviolet light generated from the plasma in the plasma generation region; an exhaust port disposed at the chamber device and disposed on the side lateral to a focal line passing through a first focal point and a second focal point of the reflection surface on the side opposite to the reflection surface with respect to the plasma generation region; and a central gas supply port formed on the side opposite to the exhaust port with respect to the plasma generation region on a supply line passing through the exhaust port, the plasma generation region, and an inner side of a peripheral portion of the reflection surface. The central gas supply port is configured to supply gas toward the exhaust port along the supply line through the plasma generation region.

An electronic device manufacturing method according to another aspect of the present disclosure includes generating plasma by irradiating a droplet with laser light using an extreme ultraviolet light generation apparatus, emitting extreme ultraviolet light generated from the plasma to an exposure apparatus, and exposing a photosensitive substrate to the extreme ultraviolet light in the exposure apparatus to produce an electronic device. The extreme ultraviolet light generation apparatus includes a chamber device including a plasma generation region, at an internal space thereof, in which plasma is generated from a droplet to which laser light is radiated; a concentrating mirror disposed in the internal space as including a spheroidal reflection surface configured to reflect extreme ultraviolet light generated from the plasma in the plasma generation region; an exhaust port disposed at the chamber device and disposed on the side lateral to a focal line passing through a first focal point and a second focal point of the reflection surface on the side opposite to the reflection surface with respect to the plasma generation region; and a central gas supply port formed on the side opposite to the exhaust port with respect to the plasma generation region on a supply line passing through the exhaust port, the plasma generation region, and an inner side of a peripheral portion of the reflection surface. The central gas supply port is configured to supply gas toward the exhaust port along the supply line through the plasma generation region.

BRIEF DESCRIPTION OF THE DRAWINGS

Embodiments of the present disclosure will be described below merely as examples with reference to the accompanying drawings.

DESCRIPTION OF EMBODIMENTS

Figure 1:
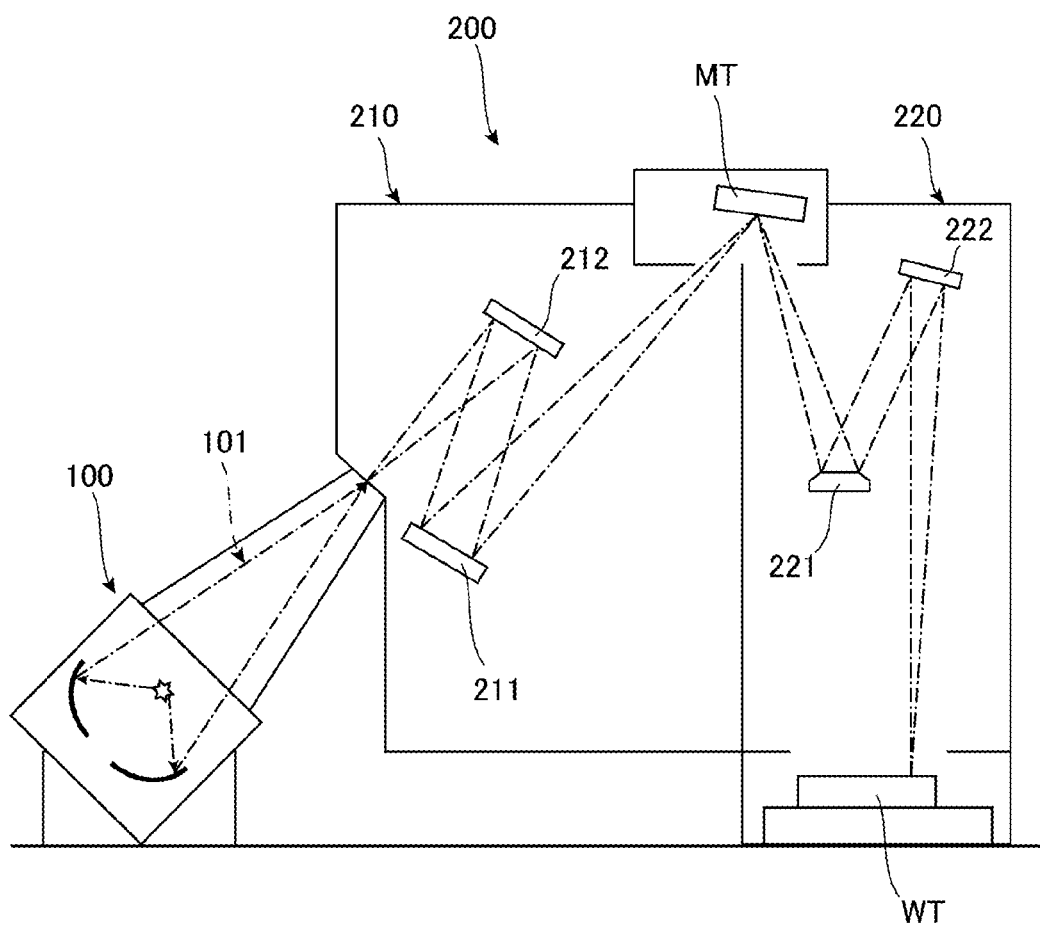
FIG. 1 is a view illustrating an exemplary entire schematic configuration of an electronic device manufacturing apparatus.

1. Overview
2. Description of electronic device manufacturing apparatus
3. Description of extreme ultraviolet light generation apparatus of comparative example
   3.1 Configuration
   3.2 Operation
   3.3 Problem
4. Description of EUV light generation apparatus of Embodiment 1
   4.1 Configuration
   4.2 Operation
   4.3 Effect
5. Description of EUV light generation apparatus of Embodiment 2
   5.1 Configuration
   5.2 Effect Hereinafter, embodiments of the present disclosure will be described in detail with reference to the drawings. The embodiments described below illustrate some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light generation apparatus generating light having a wavelength of extreme ultraviolet (EUV) light and an electronic device manufacturing apparatus. In the following, the extreme ultraviolet light is referred to as EUV light in some cases.

2. Description of Electronic Device Manufacturing Apparatus

As illustrated in FIG. 1, an electronic device manufacturing apparatus includes an EUV light generation apparatus 100 and an exposure apparatus 200. The exposure apparatus 200 includes a mask irradiation unit 210 including a plurality of mirrors 211, 212 and a workpiece irradiation unit 220 including a plurality of mirrors 221, 222. The mask irradiation unit 210 irradiates a mask pattern on a mask table MT through a reflection optical system with EUV light 101 incident from the EUV light generation apparatus 100. The workpiece irradiation unit 220 images the EUV light 101 reflected by the mask table MT onto a workpiece (not illustrated) disposed on a workpiece table WT through a reflection optical system. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

3. Description of Extreme Ultraviolet Light Generation Apparatus of Comparative Example 3.1 Configuration The EUV light generation apparatus 100 of a comparative example will be described. The comparative example of the present disclosure is an example recognized by the applicant as known only by the applicant, and is not a publicly known example admitted by the applicant.

Figure 2:
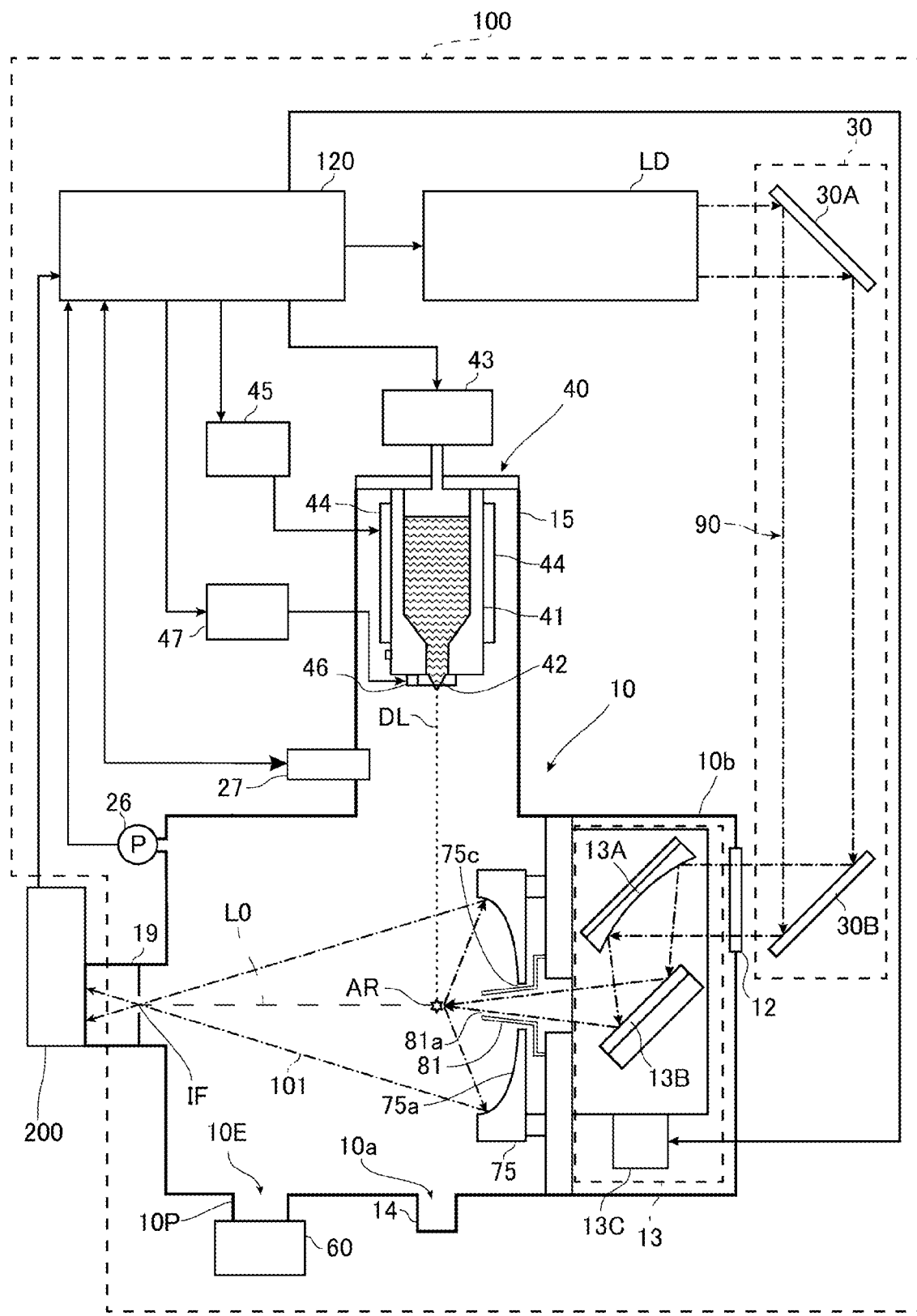
FIG. 2 is a view illustrating an exemplary entire schematic configuration of an extreme ultraviolet light generation apparatus.

FIG. 2 is a view illustrating an exemplary entire schematic configuration of the EUV light generation apparatus 100 of the present example. As illustrated in FIG. 2, the EUV light generation apparatus 100 includes a laser device LD, a chamber device 10, a processor 120, and a laser light delivery optical system 30 as a main configuration. In FIG. 2, some of the configuration of the EUV light generation apparatus 100, such as a plurality of peripheral gas supply units 83 and a gas supply device 74 to be described later, is omitted.

The chamber device 10 is a sealable container. The chamber device 10 includes an inner wall 10b surrounding an internal space having a low pressure atmosphere. The chamber device 10 includes a sub-chamber 15, and a target supply unit 40 is provided in the sub-chamber 15. The target supply unit 40 includes a tank 41 and a nozzle 42. The target supply unit 40 supplies a droplet DL to the internal space of the chamber device 10 and is attached, for example, to penetrate through a wall of the sub-chamber 15. The droplet DL, which is also called a target, is supplied from the target supply unit 40.

The tank 41 stores therein a target substance to be the droplet DL. The target substance contains tin. The inside of the tank 41 communicates, through a pipe, with a pressure adjuster 43 adjusting gas pressure. Further, a heater 44 is attached to the tank 41. The heater 44 heats the tank 41 with current applied from a heater power source 45. Through the heating, the target substance in the tank 41 melts. The pressure adjuster 43 and the heater power source 45 are electrically connected to the processor 120.

The nozzle 42 is attached to the tank 41 and discharges the target substance. A piezoelectric element 46 is attached to the nozzle 42. The piezoelectric element 46 is electrically connected to a piezoelectric power source 47 and is driven by voltage applied from the piezoelectric power source 47. The piezoelectric power source 47 is electrically connected to the processor 120. The target substance discharged from the nozzle 42 is formed into the droplet DL through operation of the piezoelectric element 46.

The chamber device 10 also includes a target collection unit 14. The target collection unit 14 is a box body attached to the inner wall 10b of the chamber device 10. The target collection unit 14 communicates with the internal space of the chamber device 10 through an opening 10a provided in the inner wall 10b of the chamber device 10. The target collection unit 14 and the opening 10a are disposed directly below the nozzle 42. The target collection unit 14 is a drain tank to collect any unnecessary droplet DL passing through the opening 10a and reaching the target collection unit 14 and to accumulate the unnecessary droplet DL.

At least one through hole is formed in the wall of the chamber device 10. The through-hole is blocked by a window 12 through which pulsed laser light 90 emitted from the laser device LD passes.

Further, a laser light concentrating optical system 13 is located in the internal space of the chamber device 10. The laser light concentrating optical system 13 includes a laser light concentrating mirror 13A and a high reflection mirror 13B. The laser light concentrating mirror 13A reflects and concentrates the laser light 90 passing through the window 12. The high reflection mirror 13B reflects light concentrated by the laser light concentrating mirror 13A. Positions of the laser light concentrating mirror 13A and the high reflection mirror 13B are adjusted by a laser light manipulator 13C so that a laser concentrating position at the internal space of the chamber device 10 coincides with a position specified by the processor 120.

For example, an EUV light concentrating mirror 75 having a spheroidal reflection surface 75a is disposed in the internal space of the chamber device 10. The reflection surface 75a reflects the EUV light 101 generated from plasma in a plasma generation region AR. The reflection surface 75a has a first focal point and a second focal point. The reflection surface 75a may be disposed such that, for example, the first focal point is located in the plasma generation region AR and the second focal point is located at an intermediate focal point IF. In FIG. 2, a straight line passing through the first focal point and the second focal point is illustrated as a focal line L0.

Further, the EUV light generation apparatus 100 includes a connection portion 19 providing communication between the internal space of the chamber device 10 and an internal space of the exposure apparatus 200. A wall in which an aperture is formed is provided inside the connection portion 19. The wall is preferably arranged such that the aperture is located at the second focal point.

Further, the EUV light generation apparatus 100 includes a pressure sensor 26 and a target sensor 27. The pressure sensor 26 and the target sensor 27 are attached to the chamber device 10 and are electrically connected to the processor 120. The pressure sensor 26 measures pressure in the internal space of the chamber device 10. The target sensor 27 has, for example, an imaging function, and detects the presence, trajectory, position, speed, and the like of the droplet DL according to an instruction from the processor 120.

The laser device LD includes a master oscillator as a light source to perform a burst operation. The master oscillator emits the pulsed laser light 90 in a burst-on duration. The master oscillator is, for example, a laser device configured to emit the laser light 90 by exciting, through electric discharge, gas as mixture of carbon dioxide gas with helium, nitrogen, or the like. Alternatively, the master oscillator may be a quantum cascade laser device. The master oscillator may emit the pulsed laser light 90 by a Q switch system. Further, the master oscillator may include an optical switch, a polarizer, and the like. In the burst operation, the continuous pulsed laser light 90 is emitted at a predetermined repetition frequency in the burst-on duration and the emission of the laser light 90 is stopped in a burst-off duration.

The travel direction of the laser light 90 emitted from the laser device LD is adjusted by the laser light delivery optical system 30. The laser light delivery optical system 30 includes a plurality of mirrors 30A and 30B for adjusting the travel direction of the laser light 90, and a position of at least one of the mirrors 30A and 30B is adjusted by an actuator (not illustrated). Owing to that the position of at least one of the mirrors 30A and 30B is adjusted, the laser light 90 can appropriately propagate to the internal space of the chamber device 10 through the window 12.

The processor 120 controls the entire EUV light generation apparatus 100 and also controls the laser device LD. The processor 120 receives a signal related to the pressure in the internal space of the chamber device 10, which is measured by the pressure sensor 26, a signal related to image data of the droplet DL captured by the target sensor 27, a burst signal from the exposure apparatus 200, and the like. The processor 120 processes the image data and the like, and may control, for example, timing at which the droplet DL is output, an output direction of the droplet DL, and the like. Further, the processor 120 may control oscillation timing of the laser device LD, the travel direction of the laser light 90, the concentrating position of the laser light 90, and the like. Such various kinds of control described above are merely exemplary, and other control may be added as necessary, as described later.

Next, a configuration of the chamber device 10 will be described in more detail.

Figure 3:
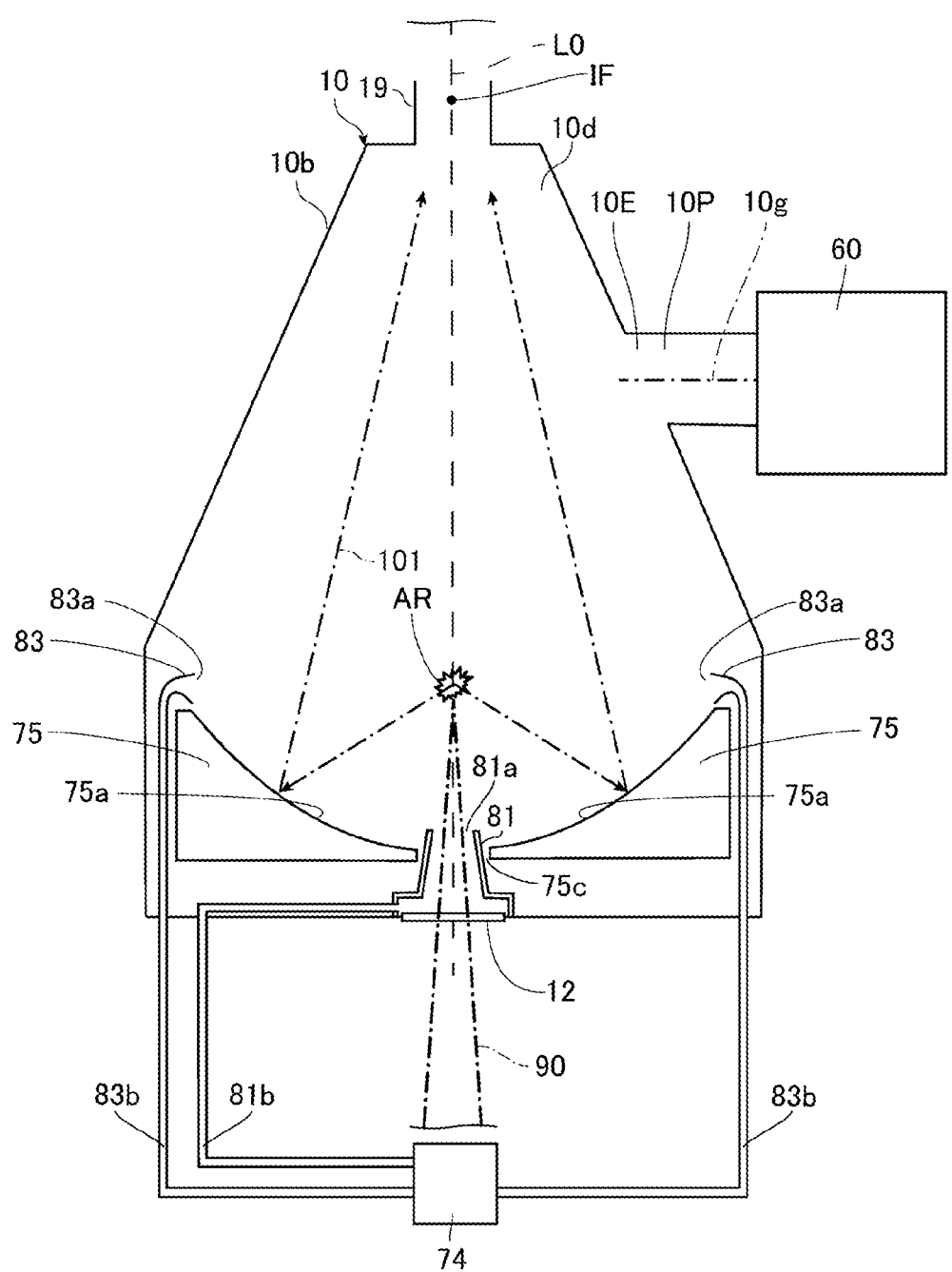
FIG. 3 is a view illustrating an exemplary schematic configuration of a part including a chamber device in a comparative example.

FIG. 3 is a view illustrating an exemplary schematic configuration of a part including the chamber device 10 in a comparative example. In FIG. 3, some of the configuration of the chamber device 10, such as the laser light concentrating optical system 13, the target supply unit 40, and the target collection unit 14 is omitted.

A central gas supply unit 81 for supplying the etching gas to the internal space of the chamber device 10, and a plurality of peripheral gas supply units 83 are disposed in the chamber device 10. As described above, since the target substance contains tin, the etching gas is, for example, hydrogen-containing gas having a hydrogen gas concentration of 100% in effect. Alternatively, the etching gas may be, for example, a balance gas having a hydrogen gas concentration of about 3%. The balance gas contains nitrogen ($N_2$) gas and argon (Ar) gas. Tin fine particles and tin charged particles are generated when the target substance forming the droplet DL is turned into plasma in the plasma generation region AR by being irradiated with the laser light 90. The etching gas contains hydrogen that reacts with tin constituting the fine particles and charged particles. Through the reaction with hydrogen, tin becomes stannane ($SnH_4$) gas at room temperature.

The central gas supply unit 81 has a shape of a side surface of a circular truncated cone and is called a cone in some cases. The central gas supply unit 81 is inserted through a first through hole 75c formed in the center of the EUV light concentrating mirror 75.

Figure 4:
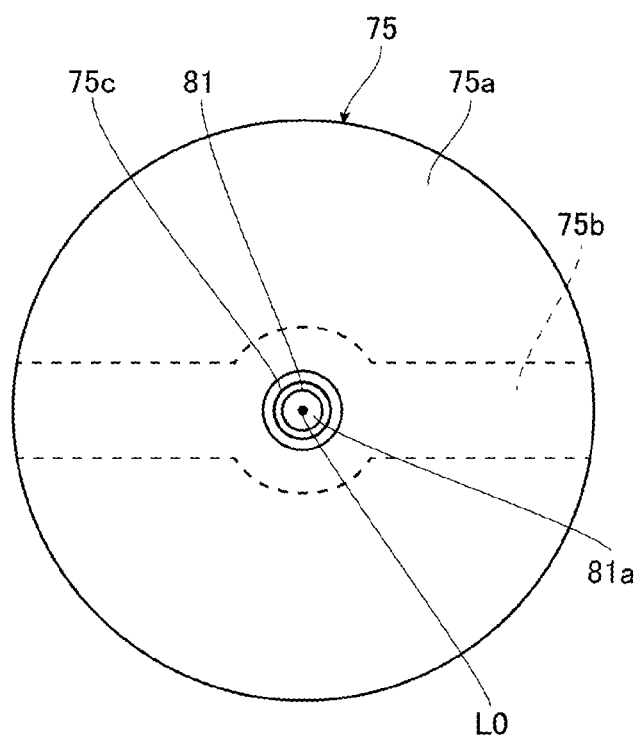
FIG. 4 is a front view of the reflection surface in the comparative example when viewed from the plasma generation region side.

FIG. 4 is a front view of the reflection surface 75a in the comparative example when viewed from the plasma generation region AR side. The central gas supply unit 81 and the first through hole 75c are provided in an obscuration region 75b on the reflection surface 75a. The obscuration region 75b refers to a spatial region corresponding to an angular range that is not utilized in the exposure apparatus 200 among a three-dimensional space of the EUV light 101 concentrated by the EUV light concentrating mirror 75. Therefore, even though the central gas supply unit 81 and the first through hole 75c are provided in the obscuration region 75b, exposure in the exposure apparatus 200 is not affected. Here, a member such as an optical element may be disposed in the obscuration region 75b, or deformation may be applied to a region on the reflection surface 75a corresponding to the obscuration region 75b.

As illustrated in FIGS. 3 and 4, the central gas supply unit 81 includes a central gas supply port 81a being a nozzle. The central gas supply port 81a is formed in the obscuration region 75b on the reflection surface 75a. The central gas supply port 81a is formed on the focal line L0 passing through the first focal point and the second focal point of the reflection surface 75a. The focal line L0 is extended along the center axis direction of the reflection surface 75a.

The central gas supply port 81a supplies the etching gas from the center side of the reflection surface 75a toward the plasma generation region AR. The central gas supply port

81a preferably supplies the etching gas in the direction away from the reflection surface 75a from the center side of the reflection surface 75a along the focal line L0. The central gas supply port 81a is connected to the gas supply device 74 which is a tank for supplying the etching gas through a pipe 81b of the central gas supply unit 81. The gas supply device 74 is driven and controlled by the processor 120. A supply gas flow rate adjusting unit (not illustrated) may be provided in the pipe 81b.

In the comparative example, the central gas supply port 81a is a gas supply port through which the etching gas is supplied to the internal space of the chamber device 10, and is also an emission port through which the laser light 90 is emitted to the internal space of the chamber device 10. The laser light 90 passes through the window 12 and the central gas supply port 81a and travels toward the internal space of the chamber device 10.

A plurality of peripheral gas supply units 83 supply the etching gas from the gas supply device 74 toward the internal space of the chamber device 10 from the peripheral portion of the reflection surface 75a.

Each of the peripheral gas supply units 83 includes a peripheral gas supply port 83a being a nozzle.

The peripheral gas supply ports 83a are connected to the gas supply device 74 through a pipe 83b of the peripheral gas supply unit 83. A supply gas flow rate adjusting unit (not illustrated) may be provided in the pipe 83b. The peripheral gas supply ports 83a are formed at the peripheral portion of the reflection surface 75a.

The peripheral gas supply ports 83a supply some part of the etching gas so that the part of the etching gas from the peripheral gas supply ports 83a flows toward the center of the reflection surface 75a from the peripheral portion of the reflection surface 75a along the reflection surface 75a. Further, the peripheral gas supply ports 83a supply some other part of the etching gas so that the other part of the etching gas from the peripheral gas supply ports 83a flows toward the plasma generation region AR from the peripheral portion of the reflection surface 75a. Further, the peripheral gas supply ports 83a supply some remaining part of the etching gas so that the remaining part of the etching gas from the peripheral gas supply ports 83a flows toward the second focal point where the intermediate focal point IF is located from the peripheral portion of the reflection surface 75a.

The plurality of peripheral gas supply ports 83a are formed on the circumference of the same circle with reference to the focal line L0. The peripheral gas supply ports 83a are formed at equal intervals in the circumferential direction of the circle. The peripheral gas supply ports 83a are formed as facing the focal line L0, and supply the etching gas in the direction from the outer side of the reflection surface 75a toward the inner side of the reflection surface 75a. Therefore, the peripheral gas supply ports 83a supply the etching gas in the direction approaching the focal line L0. In the comparative example, the direction from the outer side of the reflection surface 75a toward the inner side of the reflection surface 75a is the radial direction of the reflection surface 75a. When the etching gas is supplied from the central gas supply port 81a and the peripheral gas supply ports 83a, the etching gas from the peripheral gas supply ports 83a flows toward the etching gas from the central gas supply port 81a. The peripheral gas supply ports 83a are formed on the same plane as the target supply unit 40 and the target collection unit 14, and are not located between the target supply unit 40 and the target collection unit 14.

In a range in the direction along the focal line L0 from the connection portion 19 side to the peripheral gas supply port 83a side, the inner wall 10b of the chamber device 10 has a shape of a side surface of a circular truncated cone. The cross-sectional area of the inner wall 10b in the direction perpendicular to the focal line L0 is gradually reduced from the peripheral gas supply port 83a side toward the connection portion 19. An exhaust port 10E is formed at the inner wall 10b of the chamber device 10 on the side surface of the circular truncated cone. Since the exposure apparatus 200 is disposed on the focal line L0, the exhaust port 10E is formed not on the focal line L0 but at the inner wall 10b on the side lateral to the focal line L0. The direction along the center axis 10g of the exhaust port 10E is perpendicular to the focal line L0. Further, when viewed from the direction perpendicular to the focal line L0 the exhaust port 10E is formed on the side opposite to the reflection surface 75a with respect to the plasma generation region AR. The exhaust port 10E exhausts residual gas to be described later in the internal space of the chamber device 10. The exhaust port 10E is connected to an exhaust pipe 10P, and the exhaust pipe 10P is connected to an exhaust pump 60.

When the target substance is turned into plasma, residual gas as exhaust gas is generated in the internal space of the chamber device 10. The residual gas contains tin fine particles and tin charged particles generated through the plasma generation from the target substance, stannane generated through the reaction of the tin fine particles and tin charged particles with the etching gas, and unreacted etching gas. Some of the charged particles are neutralized in the internal space of the chamber device 10, and the residual gas contains the neutralized charged particles as well. The exhaust pump 60 sucks the residual gas through the exhaust port 10E and the exhaust pipe 10P.

3.2 Operation

Next, operation of the EUV light generation apparatus 100 of the comparative example will be described. In the EUV light generation apparatus 100, for example, at the time of new installation or maintenance or the like, atmospheric air in the internal space of the chamber device 10 is exhausted. At this time, purging and exhausting of the internal space of the chamber device 10 may be repeated for exhausting the atmospheric components. For example, inert gas such as nitrogen or argon is preferably used for the purge gas. Thereafter, when the pressure of the internal space of the chamber device 10 is equal to or less than a predetermined pressure, the processor 120 starts introduction of the etching gas from the gas supply device 74 to the internal space of the chamber device 10 through the central gas supply unit 81 and the plurality of peripheral gas supply units 83. At this time, the processor 120 may control a supply gas flow rate adjusting unit (not illustrated) and the exhaust pump 60 so that the pressure of the internal space of the chamber device 10 is maintained at the predetermined pressure. Thereafter, the processor 120 waits until a predetermined time elapses from the start of introduction of the etching gas.

Further, the processor 120 causes the gas in the internal space of the chamber device 10 to be exhausted from the exhaust port 10E by the exhaust pump 60, and keeps the pressure in the internal space of the chamber device 10 substantially constant based on the signal of the pressure in the internal space of the chamber device 10 measured by the pressure sensor 26.

In order to heat and maintain the target substance in the tank 41 at a predetermined temperature equal to or higher than the melting point, the processor 120 causes the heater power source 45 to apply current to the heater 44 to increase temperature of the heater 44. In this case, the processor 120 controls temperature of the target substance to predetermined temperature by adjusting a value of the current applied from the heater power source 45 to the heater 44 based on an output from a temperature sensor (not illustrated). Note that the predetermined temperature is, for example, 250° C. to 290° C. when the target substance is tin.

Further, the processor 120 causes the pressure adjuster 43 to adjust the pressure in the tank 41 so that the melted target substance is discharged through the hole of the nozzle 42 at a predetermined speed. The target substance discharged through the hole of the nozzle 42 may be in the form of jet. At this time, the processor 120 causes the piezoelectric power source 47 to apply a voltage having a predetermined waveform to the piezoelectric element 46 to generate the droplet DL. Vibration of the piezoelectric element 46 can propagate through the nozzle 42 to the target substance to be discharged through the hole of the nozzle 42. The target substance is divided at a predetermined cycle by the vibration, and a liquid droplet DL is generated from the target substance.

Further, the processor 120 outputs a light emission trigger signal to the laser device LD. When the light emission trigger signal is input, the laser device LD emits the pulsed laser light 90. The emitted laser light 90 is incident on the laser light concentrating optical system 13 through the laser light delivery optical system 30 and the window 12. Further, the laser light 90 travels from the laser light concentrating optical system 13 to the central gas supply unit 81 being an emission unit. The laser light 90 is emitted along the focal line L0 toward the plasma generation region AR from the central gas supply port 81*a* being the emission port in the central gas supply unit 81 and is radiated to the droplet DL in the plasma generation region AR. In this case, the processor 120 controls the laser light manipulator 13C of the laser light concentrating optical system 13 such that the laser light 90 concentrates in the plasma generation region AR. The processor 120 causes the laser device LD to emit the laser light 90 based on a signal from the target sensor 27 so that the droplet DL is irradiated with the laser light 90. Thus, the droplet DL is irradiated in the plasma generation region AR with the laser light 90 concentrated by the laser light concentrating mirror 13A. Light including EUV light is emitted from the plasma generated through the irradiation.

Among the light including the EUV light generated in the plasma generation region AR, the EUV light 101 is concentrated at the intermediate focal point IF by the EUV light concentrating mirror 75, and then is incident on the exposure apparatus 200 through the connection portion 19. Thus, it may be understood that the connection portion 19 is an emission port of the EUV light 101 in the EUV light generation apparatus 100.

When the target substance is turned into plasma, fine particles of tin are generated as described above. The fine particles diffuse into the internal space of the chamber device 10. In some cases, some of the fine particles diffused into the internal space of the chamber device 10 adheres to the reflection surface 75*a*. The fine particles adhering to the reflection surface 75*a* react with the hydrogen-containing etching gas supplied from the plurality of peripheral gas supply units 83 to become stannane. Further, the fine particles diffusing into the internal space of the chamber device 10 react with the hydrogen-containing etching gas supplied from the central gas supply unit 81 and the plurality of peripheral gas supply units 83 to become stannane. Most of the stannane obtained through the reaction with the etching gas flows into the exhaust port 10E along with the flow of the unreacted etching gas.

Further, at least some of the fine particles not adhering to the reflection surface 75*a* may become stannane through reaction with some of unreacted etching gas flowing in the internal space of the chamber device 10. Most of the stannane generated through the reaction flows into the exhaust port 10E along with the flow of the unreacted etching gas. Further, at least some of the unreacted charged particles, fine particles, and etching gas flow into the exhaust port 10E.

The unreacted etching gas, fine particles, charged particles, stannane, and the like having flowed into the exhaust port 10E flow as the residual gas through the exhaust pipe 10*p* into the exhaust pump 60 and are subjected to predetermined exhaust treatment such as detoxification.

In the comparative example, the processor 120 starts introduction of the etching gas from the gas supply device 74 to the internal space of the chamber device 10 through the central gas supply unit 81 and the plurality of peripheral gas supply units 83.

Figure 5:
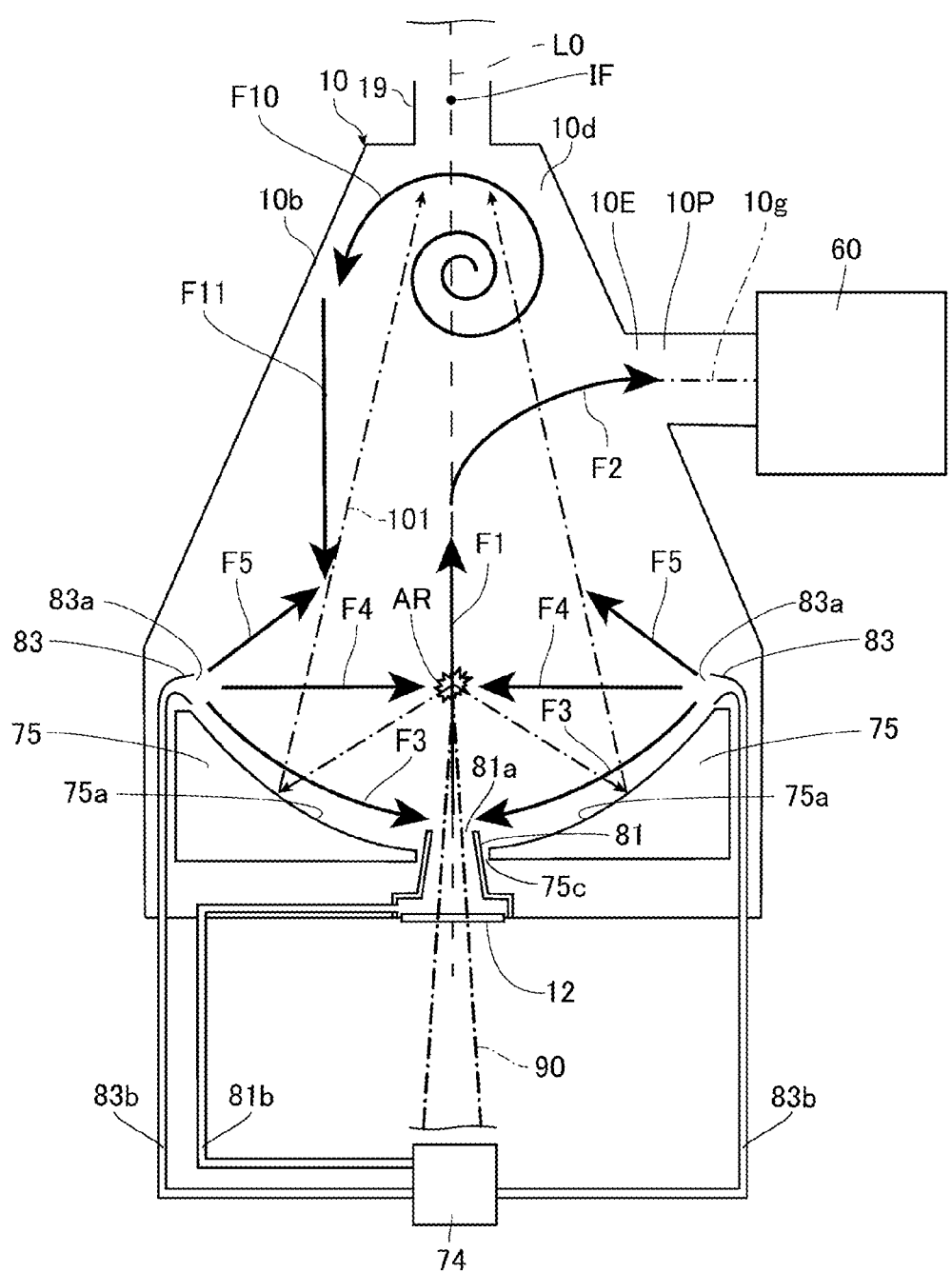
FIG. 5 is a view illustrating flow of etching gas from a central gas supply port, flow of the etching gas from a peripheral gas supply port, flow of a gas vortex, and flow of back-flow gas in the comparative example.

FIG. 5 is a view illustrating flow of the etching gas from the central gas supply port 81*a*, flow of the etching gas from the peripheral gas supply port 83*a*, flow of a gas vortex, and flow of back-flow gas in the comparative example.

In the central gas supply unit 81, the etching gas is supplied from the gas supply device 74 to the central gas supply port 81*a* through the pipe 81*b*, and is supplied from the central gas supply port 81*a* to the internal space of the chamber device 10. The supplied etching gas flows in the direction away from the reflection surface 75*a* from the center side of the reflection surface 75*a* along the focal line L0. In FIG. 5, the flow of the etching gas flowing in the direction away from the reflection surface 75*a* from the center side of the reflection surface 75*a* along the focal line L0 is indicated by a solid arrow F1. Since the pressure in the internal space of the exhaust pipe 10P is relatively low with respect to the pressure in the internal space of the chamber device 10, some of the flowing etching gas may be bent from the direction along the focal line L0 by the pressure difference toward the exhaust port 10E. Therefore, some of the etching gas flows toward the exhaust port 10E together with the residual gas in the internal space of the chamber device 10, and is sucked from the exhaust port 10E to the exhaust pump 60 through the exhaust pipe 10P together with the residual gas. In FIG. 5, flow of the etching gas bent from the direction along the focal line L0 toward the exhaust port 10E and flowing toward the exhaust port 10E is indicated by a solid arrow F2.

The exhaust port 10E is formed not on the focal line L0 but on the side lateral to the focal line L0. Therefore, in some cases, some other part of the etching gas passes by the exhaust port 10E without flowing into the exhaust port 10E and travels into a space 10*d*. The space 10*d* is a space surrounded by the inner wall 10*b* having a shape of a side surface of a circular truncated cone on the side of the connection portion 19 with respect to the exhaust port 10E. In some cases, the etching gas having traveled into the space 10*d* stays in a spiral shape, and a gas vertex is generated. In FIG. 5, flow of the gas vortex is indicated by a solid arrow F10. A gas vortex collides with some of the etching gas traveling from the central gas supply port 81*a* to the space 10*d*, and due to the collision, the direction of the flow of the etching gas is bent from the direction along the focal line L0 toward the exhaust port 10E. Accordingly, the etching gas flows toward the exhaust port 10E together with the residual gas in the internal space of the chamber device 10, and is sucked from the exhaust port 10E to the exhaust pump 60 through the exhaust pipe 10*p* together with the residual gas.

Accordingly, some of the etching gas in the gas vortex also flows toward the exhaust port 10E together with the residual gas in the internal space of the chamber device 10, and is sucked from the exhaust port 10E to the exhaust pump 60 through the exhaust pipe 10P together with the residual gas.

As described above, when the droplet DL is irradiated with the laser light 90 in the plasma generation region AR, heat is radiated due to the irradiation. The heat flows together with the etching gas from the central gas supply port 81*a* along the focal line L0 from the plasma generation region AR side in the direction away from the plasma generation region AR. Further, the heat is bent from the direction along the focal line L0 toward the exhaust port 10E together with the etching gas from the central gas supply port 81*a*, and is sucked from the exhaust port 10E to the exhaust pump 60 through the exhaust pipe 10P. Further, when the droplet DL is turned into plasma by being irradiated with the laser light 90 in the plasma generation region AR, tin fine particles are generated. The tin fine particles flow together with the etching gas from the central gas supply port 81*a* along the focal line L0 from the plasma generation region AR side in the direction away from the plasma generation region AR. Further, the tin fine particles are bent from the direction along the focal line L0 toward the exhaust port 10E together with the etching gas from the central gas supply port 81*a*, and are sucked from the exhaust port 10E to the exhaust pump 60 through the exhaust pipe 10P.

In the peripheral gas supply units 83, the etching gas is supplied from the gas supply device 74 to the peripheral gas supply ports 83*a* through the pipe 83*b*, and is supplied from the peripheral gas supply ports 83*a* to the internal space of the chamber device 10. Some of the supplied etching gas flows toward the center of the reflection surface 75*a* along the reflection surface 75*a* from the peripheral portion of the reflection surface 75*a*. In FIG. 5, the flow of the etching gas flowing toward the center of the reflection surface 75*a* along the reflection surface 75*a* from the peripheral portion of the reflection surface 75*a* is indicated by a solid arrow F3. The etching gas flowing along the reflection surface 75*a* cools the reflection surface 75*a* and suppresses thermal deformation of the reflection surface 75*a* due to the light generated from the plasma. Further, the etching gas flowing along the reflection surface 75*a* suppresses adhesion of tin to the reflection surface 75*a*. In the internal space of the chamber device 10, tin may be precipitated from the residual gas heated by the light generated from the plasma. Specifically, some of the stannane contained in the residual gas may be returned to tin through heating. If tin is precipitated from the residual gas in the internal space of the chamber device 10 and the tin adheres to the reflection surface 75*a*, the reflectivity of the reflection surface 75*a* is reduced, and concentration of the EUV light 101 toward the intermediate focal point IF by the reflection surface 75*a* may be obstructed by the tin. However, as described above, since adhesion of tin is suppressed by the etching gas flowing along the reflection surface 75*a*, the EUV light 101 is concentrated to the intermediate focal point IF.

Further, in the peripheral gas supply ports 83*a*, some other part of the etching gas flows from the peripheral gas supply port 83*a* toward the plasma generation region AR. In FIG. 5, flow of the etching gas flowing from the peripheral gas supply ports 83*a* toward the plasma generation region AR is indicated by a solid arrow F4.

Further, in the peripheral gas supply ports 83*a*, some remaining part of the etching gas flows from the peripheral gas supply ports 83*a* toward the second focal point. In FIG. 5, flow of the etching gas flowing from the peripheral gas supply port 83*a* toward the second focal point is indicated by a solid arrow F5.

The etching gas, the flow of which is indicated by the arrows F3, F4, and F5, flows along the focal line L0 in the direction away from the reflection surface 75*a* together with the etching gas from the central gas supply port 81*a*. Further, as described above, when the target substance is turned into plasma, residual gas as exhaust gas is generated in the internal space of the chamber device 10. Therefore, the etching gas from the peripheral gas supply port 83*a* flows toward the exhaust port 10E together with the etching gas from the central gas supply port 81*a* and the residual gas in the internal space of the chamber device 10, and is sucked from the exhaust port 10E to the exhaust pump 60 through the exhaust pipe 10*p* together with the residual gas. In some cases, some of the etching gas from the peripheral gas supply port 83*a* passes by the exhaust port 10E without flowing into the exhaust port 10E and travels into the space 10*d*. Thus, a gas vortex is generated in some cases. As described above, the gas vortex bends the direction of the flow of the etching gas from the central gas supply port 81*a* from the direction along the focal line L0 toward the exhaust port 10E.

As described above, due to the etching gas from at least one of the central gas supply port 81*a* and the peripheral gas supply port 83*a*, the gas vortex is generated in the space 10*d* in some cases. When the gas vortex is generated, in some cases, the etching gas in the form of the gas vortex flows back toward the reflection surface 75*a* from the space 10*d* side in the direction along the focal line L0. Hereinafter, the etching gas flowing backward in this manner is referred to as a back-flow gas in some cases. In FIG. 5, flow of some of the back-flow gas is indicated by a solid arrow F11. As described above, some of the etching gas from the peripheral gas supply port 83*a* flows toward the second focal point from the peripheral gas supply port 83*a*. When the etching gas collides with the back-flow gas, contact of the back-flow gas with the reflection surface 75*a* is suppressed. Accordingly, traveling of the residual gas to the reflection surface 75*a* together with the back-flow gas is suppressed, and adhesion of tin to the reflection surface 75*a* is suppressed even when tin is precipitated from the residual gas.

3.3 Problem

The gas vortex may cause the trajectory and position of the droplet DL to vary. Factors thereof mainly include the following two factors.

First, the gas vortex spreads to the etching gas from the central gas supply port 81*a* and the peripheral gas supply ports 83*a*, and flow of the etching gas varies. Variations in the flow of the etching gas cause variations in the trajectory and position of the droplet DL. Second, since the etching gas applies fluid resistance according to the density, speed, and direction of the etching gas to the droplet DL, the etching gas may be a factor of variations in the trajectory and position of the droplet DL. In particular, the back-flow gas increases variations in the density, velocity, and direction of the etching gas located on the trajectory of the droplet DL. Accordingly, the back-flow gas further applies fluid resistance to the droplet DL, so that the trajectory and position of the droplet DL greatly vary.

When the trajectory and position of the droplet DL vary, accuracy of irradiation of the droplet DL with the laser light 90 is decreased. In this case, for example, the droplet DL may be irradiated with the laser light 90 at an unintentional position and there is concern that the EUV light 101 may not be generated. Alternatively, the droplet DL may not be irradiated with the laser light and there is concern that the EUV light 101 is not generated. Further, it is conceivable that the droplet DL flows in an unintended direction without traveling to the target collection unit 14 due to variations. In this case, a structural element of the internal space of the chamber device 10, such as the reflection surface 75a, may be contaminated by the droplet DL. Further, in some cases, a large amount of tin is generated due to the decrease in accuracy of irradiation, and concentration of tin in the etching gas existing around the reflection surface 75a is increased. Accordingly, tin adheres to the reflection surface 75a, and the reflection surface 75a is contaminated. Such contamination of the structural element of the internal space of the chamber device 10 may cause failure of the chamber device 10.

Further, the gas vortex may also cause contamination of the reflection surface 75a. Main factors of the contamination include the following.

In a process of traveling of the back-flow gas to the reflection surface 75a, the back-flow gas takes in tin fine particles in the internal space of the chamber device 10. When some of the back-flow gas travels to the reflection surface 75a in a state of taking in the fine particles, tin adheres to the reflection surface 75a and the reflection surface 75a is contaminated. Such contamination may cause failure of the chamber device 10.

Therefore, in the following embodiments, the EUV light generation apparatus 100 is exemplified in which failure of the EUV light generation apparatus 100 due to the gas vertex can be suppressed by suppressing generation of the gas vertex.

4. Description of EUV Light Generation Apparatus of Embodiment 1

Next, a configuration of the EUV light generation apparatus 100 of Embodiment 1 will be described. Any component same as that described above is denoted by an identical reference sign, and duplicate description thereof is omitted unless specific description is needed.

4.1 Configuration

Figure 6:
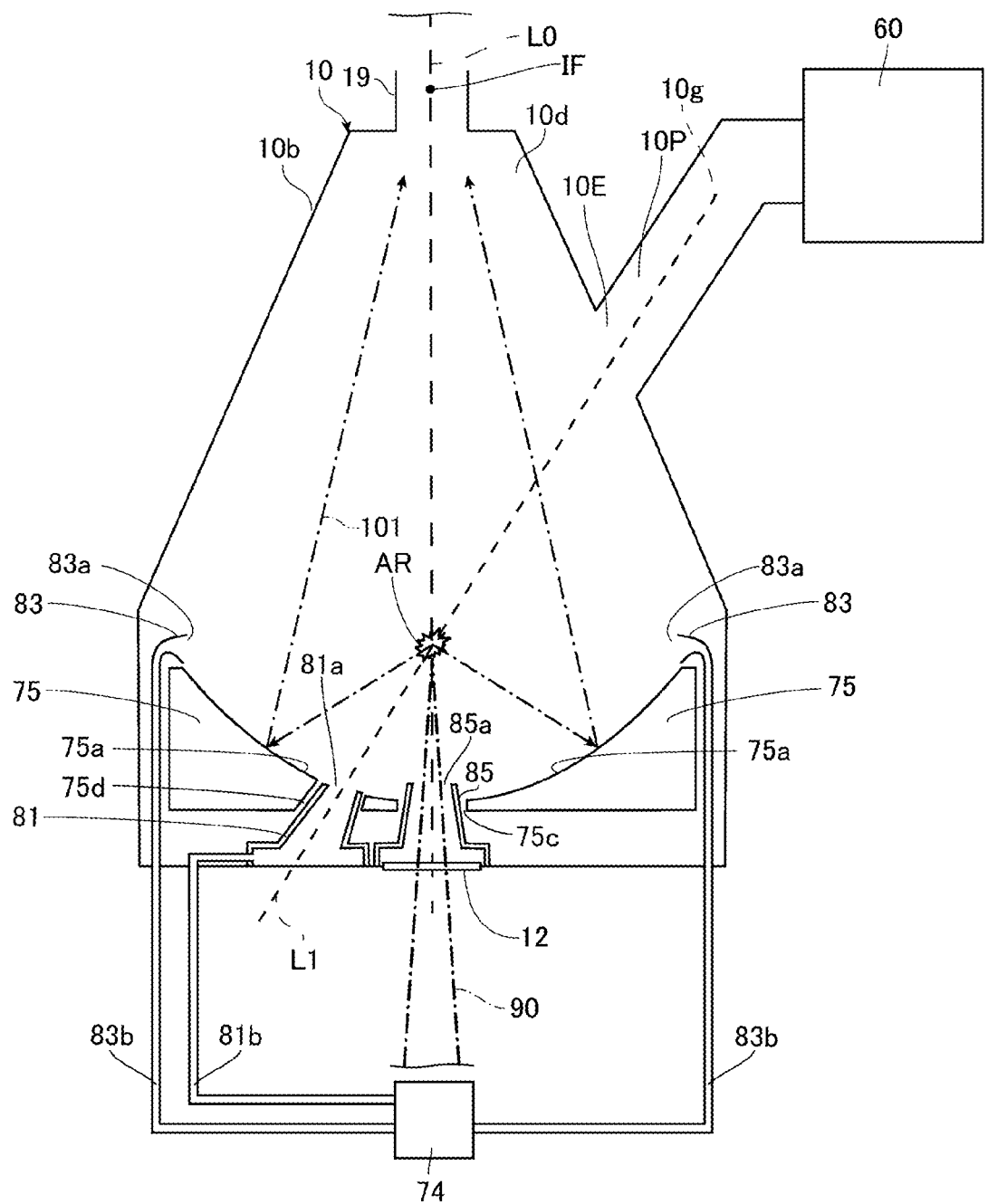
FIG. 6 is a view illustrating an exemplary schematic configuration of a part including the chamber device in Embodiment 1.

FIG. 6 is a view illustrating an exemplary schematic configuration of a part including the chamber device 10 in the present embodiment. In FIG. 6, similarly to FIG. 3, some of the configuration of the chamber device 10, such as the laser light concentrating optical system 13, the target supply unit 40, and the target collection unit 14 is omitted.

The central gas supply port 81a of the comparative example is a gas supply port through which the etching gas is supplied to the internal space of the chamber device 10, and is also an emission port through which the laser light 90 is emitted to the internal space of the chamber device 10. However, unlike the central gas supply port 81a of the comparative example, the central gas supply port 81a of the present embodiment is formed separately from the emission port. Further, the central gas supply unit 81 including the central gas supply port 81a of the present embodiment is provided at a position different from that of the central gas supply unit 81 including the central gas supply port 81a of the comparative example.

First, an emission unit 85 including an emission port 85a of the present embodiment will be described.

The emission unit 85 and the emission port 85a correspond to the central gas supply unit 81 and the central gas supply port 81a of the comparative example. Accordingly, the emission unit 85 has a shape of a side surface of a circular truncated cone and is called a cone in some cases. The cross-sectional area of the emission unit 85 in the direction perpendicular to the focal line L0 is gradually reduced toward the plasma generation region AR. Further, the emission unit 85 is inserted through the first through hole 75c formed in the central portion of the EUV light concentrating mirror 75.

Figure 7:
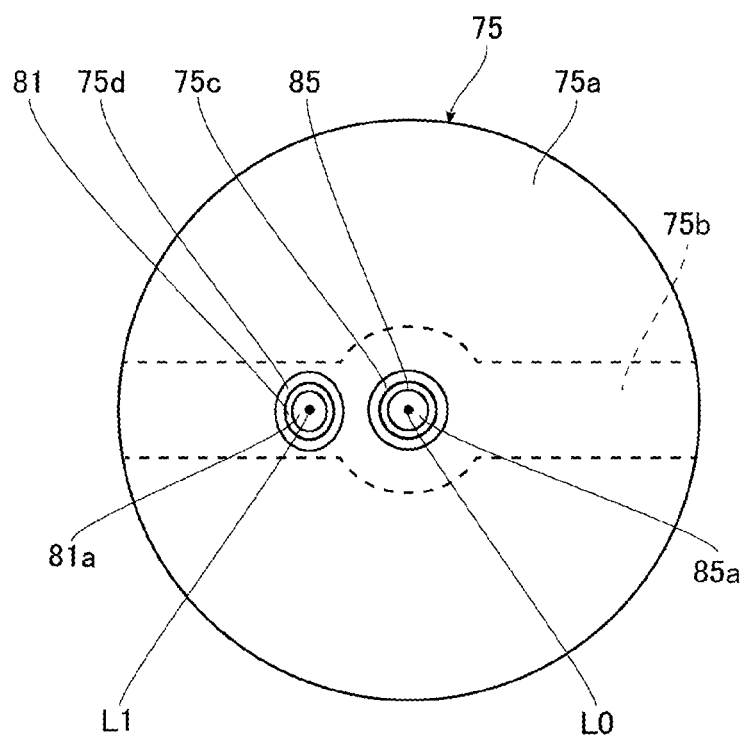
FIG. 7 is a front view of the reflection surface in Embodiment 1 when viewed from the plasma generation region side.

FIG. 7 is a front view of the reflection surface 75a in Embodiment 1 when viewed from the plasma generation region AR side. The emission port 85a, the emission unit 85, and the first through hole 75c are provided in the obscuration region 75b on the reflection surface 75a. The center axes of the emission port 85a, the emission unit 85, and the first through hole 75c extend on the focal line L0. Further, the emission port 85a is a nozzle.

Next, description will be provided on the central gas supply unit 81 including the central gas supply port 81a of the present embodiment.

As illustrated in FIG. 6, similarly to the central gas supply unit 81 of the comparative example, the central gas supply unit 81 of the present embodiment has a shape of a side surface of a circular truncated cone and is called a cone in some cases. The center axis of the central gas supply unit 81 extends on a supply line L1 passing through the exhaust port 10E, the plasma generation region AR, and an inner side from the peripheral portion of the reflection surface 75a. Since the exhaust port 10E is formed on the side lateral to the focal line L0, the supply line L1 is a line inclined with respect to the focal line L0. The supply line L1 is also a straight line passing through the center axis 10g of the exhaust port 10E, the plasma generation region AR, and the obscuration region 75b on the reflection surface 75a. Therefore, the direction along the center axis 10g of the exhaust port 10E is inclined with respect to the focal line L0. The cross-sectional area of the central gas supply unit 81 in the direction perpendicular to the supply line L1 is gradually reduced toward the plasma generation region AR. The central gas supply unit 81 is inserted through a second through hole 75d formed in the EUV light concentrating mirror 75.

As illustrated in FIGS. 6 and 7, the central gas supply port 81a is formed on the side opposite to the exhaust port 10E with respect to the plasma generation region AR on the supply line L1. Since the central gas supply port 81a of the present embodiment is not formed on the focal line L0, the central gas supply port 81a is formed at a position different from the emission port 85a provided on the focal line L0. Further, the center axis of the central gas supply port 81a extends at a position different from the optical axis of the laser light 90 emitted from the emission port 85a. The center axis of the central gas supply port 81a preferably extends on the supply line L1. The central gas supply port 81a is smaller than the exhaust port 10E, and the central gas supply port 81a is formed as facing the exhaust port 10E. Therefore, when the exhaust port 10E side is viewed from the central gas supply port 81a side, the entire projection surface range of the central gas supply port 81a projected on a plane perpendicular to the center line of the central gas supply port 81a is located within the exhaust port 10E. Further, the central gas supply port 81a is larger than the plasma generation region AR, and the entire plasma generation region AR is formed as facing the central gas supply port 81a. Therefore, when the central gas supply port 81a side is viewed from the plasma generation region AR side, the entire projection surface range of the plasma generation region AR projected on a plane perpendicular to the supply line L1 is located within the central gas supply port 81a.

As illustrated in FIG. 7, although the central gas supply port 81a, the central gas supply unit 81, and the second through hole 75d are provided in the obscuration region 75b on the reflection surface 75a, the emission unit 85 and the first through hole 75c are provided at different positions. The central gas supply port 81a, the central gas supply unit 81, and the second through hole 75d are provided adjacent to the emission port 85a, the emission unit 85, and the first through hole 75c in the radial direction of the reflection surface 75a, but are not provided on the focal line L0.

The central gas supply port 81a supplies the etching gas along the supply line L1 in the direction away from the reflection surface 75a from the reflection surface 75a side. Since the supply line L1 is inclined with respect to the direction along the focal line L0, the supply direction of the etching gas from the central gas supply port 81a, which is the direction along the supply line L1, is inclined with respect to the direction along the focal line L0. Further, the central gas supply port 81a supplies the etching gas from the reflection surface 75a side along the supply line L1 toward the exhaust port 10E through the plasma generation region AR.

Here, description will be provided on a flux density of the etching gas in the central gas supply port 81a. The flux density represents an average value of the mass of the etching gas passing through the central gas supply port 81a per unit time and unit area. Here, A represents a flux density of the etching gas in the central gas supply port 81a, M represents a mass of the etching gas passing through the central gas supply port 81a per second, and S represents effective cross-sectional area of the central gas supply port 81a. The effective cross-sectional area S is area of the projection surface range of the central gas supply port 81a projected on a plane perpendicular to the center axis of the central gas supply port 81a. The flux density A is calculated by following Equation (1) based on the mass M and the effective cross-sectional area S.

$$A = M/S \qquad (1)$$

In the present embodiment, the flux density A calculated by Equation (1) is preferably, for example, $7.5 \times 10^{-3}$ (kg·m$^{-2}$·s$^{-1}$) or more and $1.5 \times 10^{-1}$ (kg·m$^{-2}$·s$^{-1}$) or less.

Here, the flux density A1 of the etching gas flowing toward the plasma generation region AR from the peripheral gas supply port 83a is also calculated by Equation (1) based on mass M1 of the etching gas passing through the peripheral gas supply port 83a per second and effective cross-sectional area S1 of the peripheral gas supply port 83a. Based on each mass M, M1 and each effective cross-sectional area S, S1, the flux density A is made higher than the flux density A1. Accordingly, the central gas supply port 81a supplies the etching gas having the greatest flux density among the etching gas passing through the plasma generation region AR in the chamber device 10.

4.2 Operation

Figure 8:
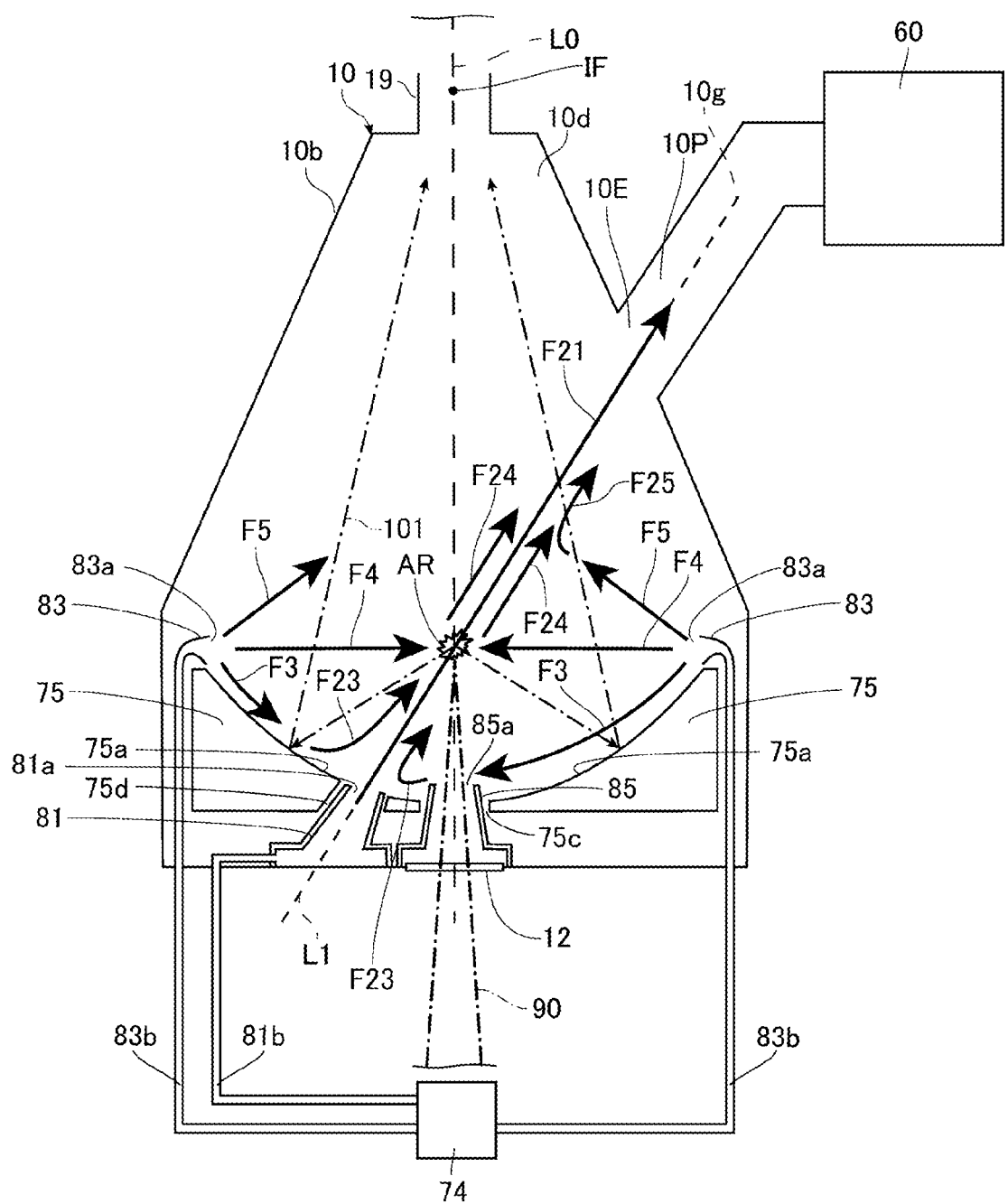
FIG. 8 is a view illustrating flow of the etching gas from the central gas supply port and flow of the etching gas from the peripheral gas supply port in Embodiment 1.

Next, operation of the laser device LD, the central gas supply unit 81, and the peripheral gas supply unit 83 in the present embodiment will be described. FIG. 8 is a view illustrating flow of the etching gas from the central gas supply port 81a and flow of the etching gas from the peripheral gas supply port 83a in Embodiment 1.

In the present embodiment, similarly to the comparative example, the laser device LD emits the laser light 90. The laser light 90 is incident on the laser light concentrating optical system 13 through the laser light delivery optical system 30 and the window 12. Further, the laser light 90 travels from the laser light concentrating optical system 13 to the emission unit 85. The laser light 90 is emitted along the focal line L0 toward the plasma generation region AR from the emission port 85a of the emission unit 85, and is radiated to the droplet DL in the plasma generation region AR. Light including EUV light is emitted from the plasma generated through the irradiation. Among the light including the EUV light generated in the plasma generation region AR, the EUV light 101 is concentrated at the intermediate focal point IF by the EUV light concentrating mirror 75, and then is incident on the exposure apparatus 200 through the connection portion 19.

In the present embodiment, similarly to the comparative example, in the central gas supply unit 81, the etching gas is supplied from the gas supply device 74 to the central gas supply port 81a through the pipe 81b, and is supplied from the central gas supply port 81a to the internal space of the chamber device 10. In the present embodiment, the supplied etching gas flows along the supply line L1 in the direction away from the reflection surface 75a from the reflection surface 75a side. The flowing etching gas flows from the reflection surface 75a side along the supply line L1 through the plasma generation region AR toward the exhaust port 10E together with the residual gas in the internal space of the chamber device 10. In FIG. 8, flow of the etching gas flowing along the supply line L1 from the central gas supply port 81a through the plasma generation region AR toward the exhaust port 10E is indicated by a solid arrow F21. Further, the flowing etching gas is sucked from the exhaust port 10E to the exhaust pump 60 through the exhaust pipe 10P together with the residual gas.

In the present embodiment, similarly to the comparative example, when the droplet DL is irradiated with the laser light 90 in the plasma generation region AR, heat is radiated due to the irradiation. In the present embodiment, the heat flows in the direction away from the reflection surface 75a along the supply line L1 together with the etching gas from the central gas supply port 81a, and is sucked from the exhaust port 10E to the exhaust pump 60 through the exhaust pipe 10P. In the present embodiment, similarly to the comparative example, tin fine particles are generated when the droplet DL is turned into plasma in the plasma generation region AR by being irradiated with the laser light 90. In the present embodiment, the tin fine particles flow along the supply line L1 together with the etching gas from the central gas supply port 81a in the direction away from the plasma generation region AR from the plasma generation region AR side, and are sucked from the exhaust port 10E to the exhaust pump 60 through the exhaust pipe 10P.

In the present embodiment, similarly to the comparative example, in the peripheral gas supply unit 83, the etching gas is supplied from the gas supply device 74 to the peripheral gas supply ports 83a through the pipe 83b, and is supplied from the peripheral gas supply ports 83a to the internal space of the chamber device 10. Some of the supplied etching gas flows toward the center of the reflection surface 75a along the reflection surface 75a from the peripheral portion of the reflection surface 75a. In FIG. 8, the flow of the etching gas flowing toward the center of the reflection surface 75a along the reflection surface 75a from the peripheral portion of the reflection surface 75a is indicated by the solid arrow F3. The etching gas flowing along the reflection surface 75a cools the reflection surface 75a and suppresses thermal deformation of the reflection surface 75a due to the light generated from the plasma. Further, the etching gas flowing along the reflection surface 75a suppresses adhesion of tin to the reflection surface 75a. Thus, decrease in reflectance of the reflection surface 75a is suppressed, and the EUV light 101 is concentrated at the intermediate focal point IF.

Further, in the present embodiment, some of the etching gas from the peripheral gas supply port 83a flows from the peripheral portion of the reflection surface 75a to the central gas supply port 81a. Accordingly, some of the etching gas from the peripheral gas supply port 83a flows along the supply line L1 in the direction away from the reflection surface 75a together with the etching gas from the central gas supply port 81a due to the flow of the etching gas from the central gas supply port 81a. In FIG. 8, flow of the etching gas flowing in the direction away from the reflection surface 75a along the supply line L1 is indicated by a solid arrow F23. The flowing etching gas flows toward the exhaust port 10E through the plasma generation region AR together with the etching gas from the central gas supply port 81a and the residual gas in the internal space of the chamber device 10, and is sucked from the exhaust port 10E to the exhaust pump 60 through the exhaust pipe 10P together with the residual gas.

Further, in the present embodiment, similarly to the comparative example, in the peripheral gas supply ports 83a, some other part of the etching gas flows from the peripheral gas supply ports 83a toward the plasma generation region AR. In FIG. 8, flow of the etching gas flowing from the peripheral gas supply port 83a toward the plasma generation region AR is indicated by the solid arrow F4.

In the present embodiment, some other part of the etching gas from the peripheral gas supply ports 83a flows to the plasma generation region AR through which the etching gas from the central gas supply port 81a flows along the supply line L1. Accordingly, some other part of the etching gas from the peripheral gas supply ports 83a flows along the supply line L1 in the direction away from the reflection surface 75a together with the etching gas from the central gas supply port 81a due to the flow of the etching gas from the central gas supply port 81a. In FIG. 8, flow of the etching gas flowing in the direction away from the reflection surface 75a along the supply line L1 is indicated by a solid arrow F24. The flowing etching gas flows toward the exhaust port 10E through the plasma generation region AR together with the etching gas from the central gas supply port 81a and the residual gas in the internal space of the chamber device 10, and is sucked from the exhaust port 10E to the exhaust pump 60 through the exhaust pipe 10P together with the residual gas.

Further, in the present embodiment, similarly to the comparative example, in the peripheral gas supply ports 83a, some remaining part of the etching gas flows from the peripheral gas supply ports 83a toward the second focal point. In FIG. 8, flow of the etching gas flowing from the peripheral gas supply ports 83a toward the second focal point is indicated by the solid arrow F5.

In the present embodiment, some remaining part of the etching gas from the peripheral gas supply ports 83a flows to the etching gas from the central gas supply port 81a flowing along the supply line L1. Accordingly, some remaining part of the etching gas from the peripheral gas supply ports 83a flows along the supply line L1 in the direction away from the reflection surface 75a together with the etching gas from the central gas supply port 81a due to the flow of the etching gas from the central gas supply port 81a. In FIG. 8, flow of the etching gas flowing in the direction away from the reflection surface 75a along the supply line L1 is indicated by a solid arrow F25. The flowing etching gas flows toward the exhaust port 10E through the plasma generation region AR together with the etching gas from the central gas supply port 81a and the residual gas in the internal space of the chamber device 10, and is sucked from the exhaust port 10E to the exhaust pump 60 through the exhaust pipe 10P together with the residual gas.

Similar to the comparative example, when the droplet DL is irradiated with the laser light 90 in the plasma generation region AR, heat is radiated due to the irradiation. The heat flows in the direction away from the reflection surface 75a together with the etching gas from the peripheral gas supply ports 83a, and is sucked from the exhaust port 10E to the exhaust pump 60 through the exhaust pipe 10P. Further, when the droplet DL is turned into plasma by being irradiated with the laser light 90 in the plasma generation region AR, tin fine particles are generated. In the present embodiment, tin fine particles flow in the direction away from the plasma generation region AR from the plasma generation region AR side along the supply line L1 together with the etching gas from the peripheral gas supply ports 83a, and are sucked from the exhaust port 10E to the exhaust pump 60 through the exhaust pipe 10P.

4.3 Effect

In the EUV light generation apparatus 100 of the present embodiment, the exhaust port 10E is formed on the side lateral to the focal line L0. The central gas supply port 81a is formed on the supply line L1 inclined with respect to the focal line L0, and is formed on the side opposite to the exhaust port 10E with reference to the plasma generation region AR. Further, the central gas supply port 81a supplies the etching gas toward the exhaust port 10E through the plasma generation region AR along the supply line L1.

Therefore, the etching gas from the central gas supply port 81a can easily flow into the exhaust port 10E, and generation of gas vertex in the space 10d can be suppressed while traveling of the etching gas to the space 10d is suppressed. Accordingly, variations in the trajectory and position of the droplet DL due to the gas vortex can be suppressed, and decrease in accuracy of irradiation of the droplet DL with the laser light 90 can be suppressed. Further, since generation of the gas vortex is suppressed, contamination of the reflection surface 75a due to the gas vortex can be suppressed.

Therefore, in the EUV light generation apparatus 100 of the present embodiment, failure of the EUV light generation apparatus 100 due to the gas vortex can be suppressed by suppressing generation of the gas vortex.

Further, in the EUV light generation apparatus 100 of the present embodiment, generation of the back-flow gas can be suppressed by suppressing generation of the gas vortex. Accordingly, contact of the back-flow gas with the reflection surface 75a can be suppressed, traveling of the residual gas to the reflection surface 75a together with the back-flow gas is suppressed, and adhesion of tin to the reflection surface 75a can be suppressed even when tin is precipitated from the residual gas.

Further, the gas vortex in the space 10d may cause increase in the supply amount of the etching gas from the peripheral gas supply port 83a. Main factors of the increase include the following. In order to suppress contact of the back-flow gas to the reflection surface 75a, the etching gas from the peripheral gas supply ports 83a needs to collide with the back-flow gas. For this purpose, it is necessary for the peripheral gas supply ports 83a to supply the etching gas toward the second focal point from the reflection surface 75a, and the supply amount of the etching gas from the peripheral gas supply ports 83a is increased.

However, in the EUV light generation apparatus 100 of the present embodiment, owing to that generation of the gas vortex is suppressed and generation of the back-flow gas is suppressed, increase of the supply amount of the etching gas supplied from the peripheral gas supply ports 83a for colliding with the back-flow gas can be suppressed.

Further, in the EUV light generation apparatus 100 of the present embodiment, the central gas supply port 81a is formed in the obscuration region 75b on the reflection surface 75a. Thus, influence of the central gas supply port 81a on exposure in the exposure apparatus 200 can be suppressed.

Further, in the EUV light generation apparatus 100 of the present embodiment, the central gas supply port 81a is formed as facing the exhaust port 10E. Thus, the etching gas from the central gas supply port 81a can flow into the exhaust port 10E more easily.

Further, in the EUV light generation apparatus 100 of the present embodiment, the center axes of the central gas supply unit 81 and the central gas supply port 81a extend on the supply line L1. Accordingly, the etching gas from the central gas supply port 81a can easily flow along the supply line L1, and can flow into the exhaust port 10E more easily.

Figure 9:
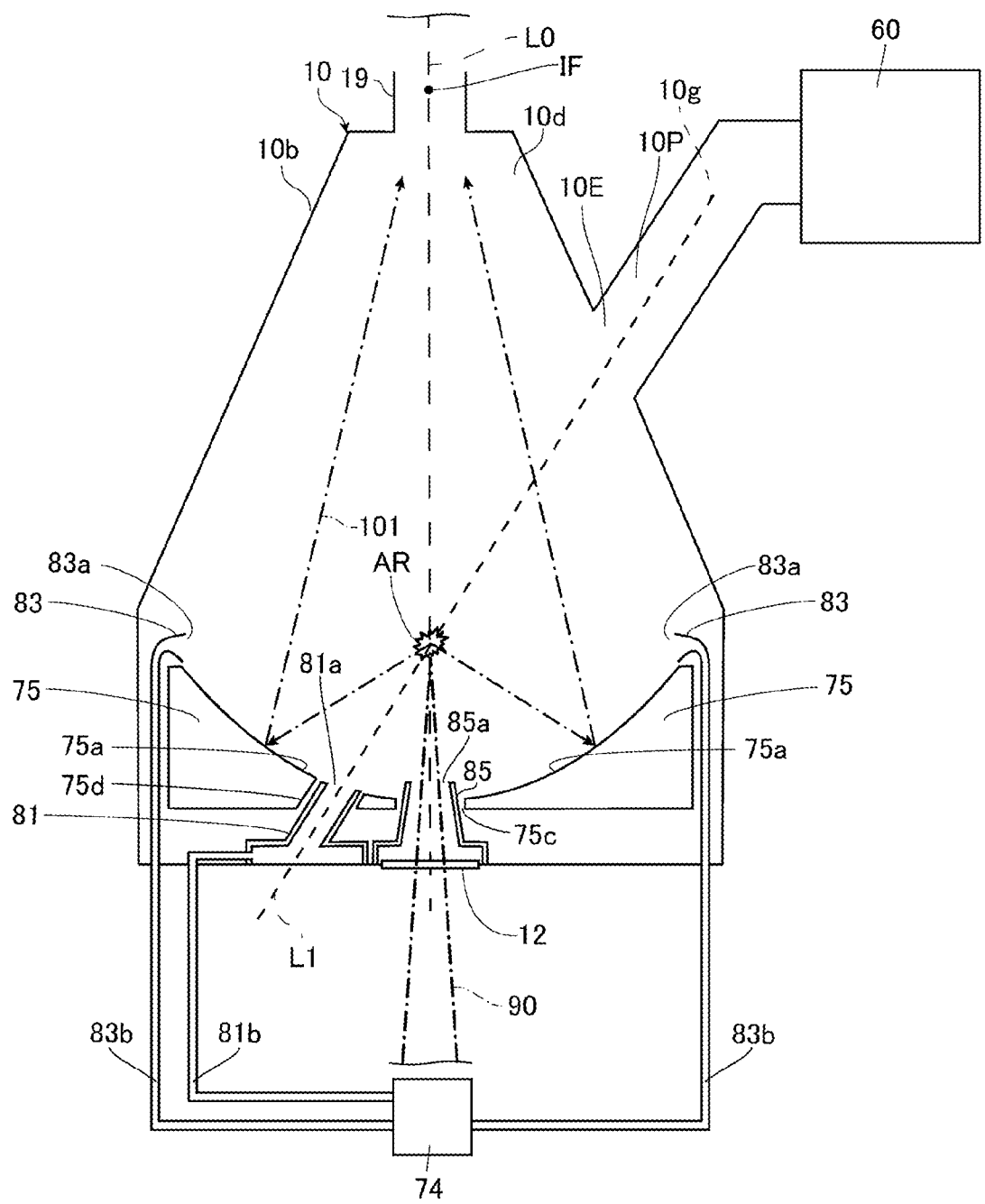
FIG. 9 is a view illustrating a modification of a central gas supply unit of Embodiment 1.

Further, in the EUV light generation apparatus 100 of the present embodiment, the central gas supply unit 81 has a shape of a side surface of a circular truncated cone. Accordingly, the etching gas from the central gas supply port 81a can converge on the supply line L1, and can be emitted toward the plasma generation region AR in a state of high flux density. Here, as illustrated in FIG. 9, the central gas supply unit 81 may have a shape of a side surface of a cylinder, and the center axis of the central gas supply unit 81 may extend on the supply line L1. Accordingly, as compared with the case where the central gas supply unit 81 has a shape of a side surface of a circular truncated cone, the etching gas from the central gas supply port 81a can easily flow along the supply line L1 with diffusion suppressed, and can easily flow into the exhaust port 10E.

In the EUV light generation apparatus 100 of the present embodiment, it is preferable that the flux density A of the etching gas in the central gas supply port 81a is $7.5 \times 10^{-3}$ (kg·m$^{-2}$·s$^{-1}$) or more and $1.5 \times 10^{-1}$ (kg·m$^{-2}$·s$^{-1}$) or less. In the EUV light generation apparatus 100 of the present embodiment, in the plasma generation region AR, heat is radiated due to irradiation of the droplet DL with the laser light 90. Further, in the plasma generation region AR, tin fine particles are generated when the droplet DL is turned into plasma by being irradiated with the laser light 90. With the etching gas having the flux density A within the above range, heat and tin particles can efficiently flow toward the exhaust port 10E.

Further, according to Equation (1), the central gas supply port 81a can supply the etching gas having the largest flux density along the supply line L1 through the plasma generation region AR toward the exhaust port 10E, among the etching gas passing through the plasma generation region AR in the chamber device 10. Accordingly, the residual gas and heat radiated due to irradiation of the droplet DL with the laser light 90 in the plasma generation region AR can easily flow to the exhaust port 10E together with the etching gas.

Further, in the EUV light generation apparatus 100 of the present embodiment, the emission port 85a is formed separately from the central gas supply port 81a. Accordingly, the emission port 85a and the central gas supply port 81a can be individually designed, and the degree of freedom in arrangement of the emission port 85a and the central gas supply port 81a can be improved.

Further, in the EUV light generation apparatus 100 of the present embodiment, the emission port 85a is formed in the obscuration region 75b on the reflection surface 75a. Thus, influence of the emission port 85a on exposure in the exposure apparatus 200 can be suppressed.

Further, in the EUV light generation apparatus 100 of the present embodiment, the emission port 85a is formed on the focal line L0. Thus, the laser light 90 can be easily radiated to the plasma generation region AR at the first focal point.

Figure 10:
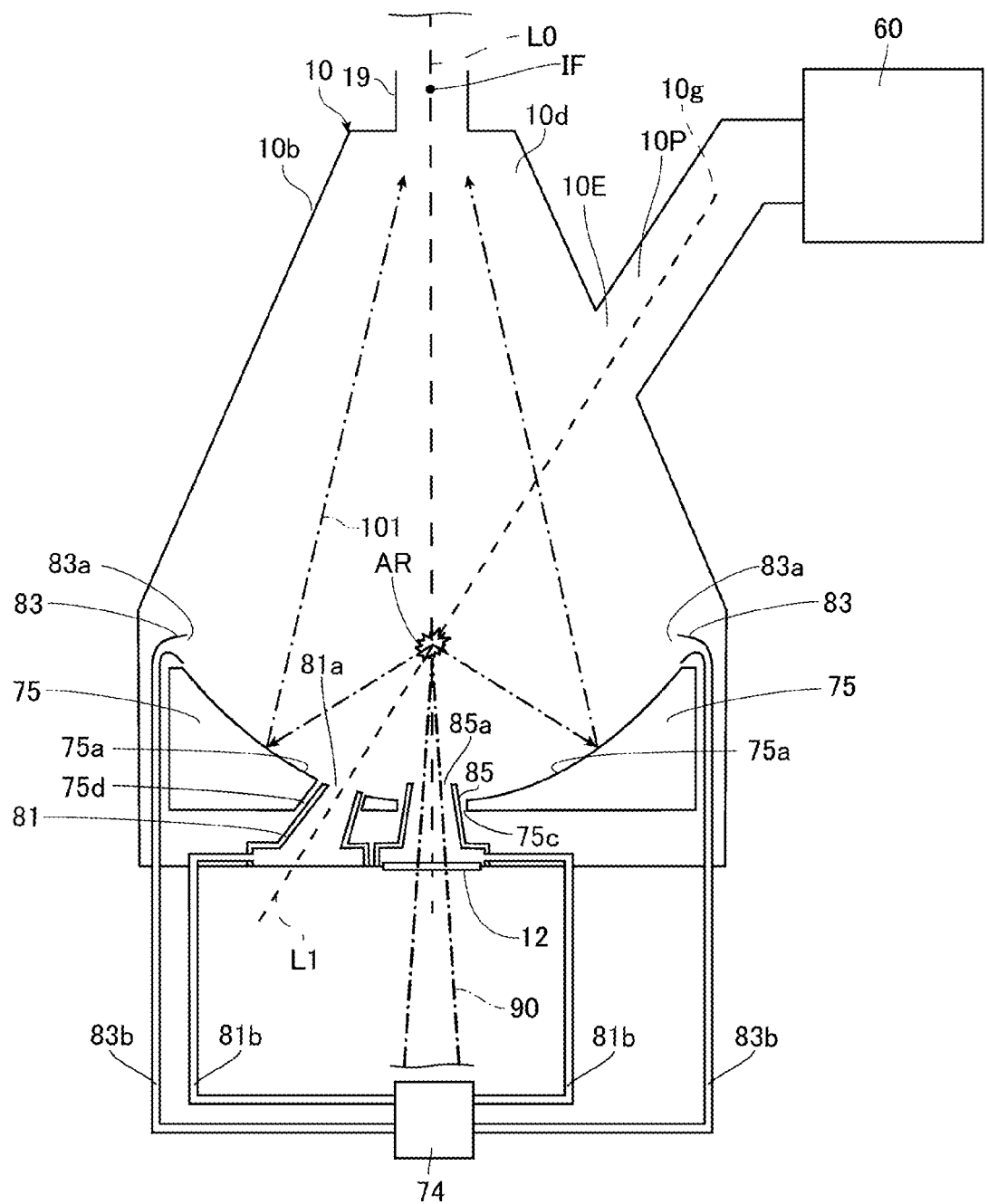
FIG. 10 is a view illustrating a modification of an emission port of Embodiment 1.

Here, as illustrated in FIG. 10, similarly to the comparative example, the emission port 85a of the present embodiment may be the central gas supply port and connected to the gas supply device 74 through the pipe 81b. That is, in the present embodiment, the central gas supply ports 81a may be formed at two positions. Further, the central gas supply port 81a and the central gas supply unit 81 may protrude from the second through hole 75d as long as being provided in the obscuration region 75b on the reflection surface 75a. Further, the central gas supply port 81a and the central gas supply unit 81 need not be provided in the obscuration region 75b on the reflection surface 75a, but may be located in the internal space of the second through hole 75d without protruding from the second through hole 75d. Further, at least some of the central gas supply port 81a may be formed to face the exhaust port 10E. When the exhaust port 10E side is viewed from the central gas supply port 81a side, at least some of the projection surface range of the central gas supply port 81a projected on a plane perpendicular to the center line of the central gas supply port 81a may be located within the exhaust port 10E.

5. Description of EUV Light Generation Apparatus of Embodiment 2

Next, a configuration of the EUV light generation apparatus 100 of Embodiment 2 will be described. Any component same as that described above is denoted by an identical reference sign, and duplicate description thereof is omitted unless specific description is needed.

5.1 Configuration

Figure 11:
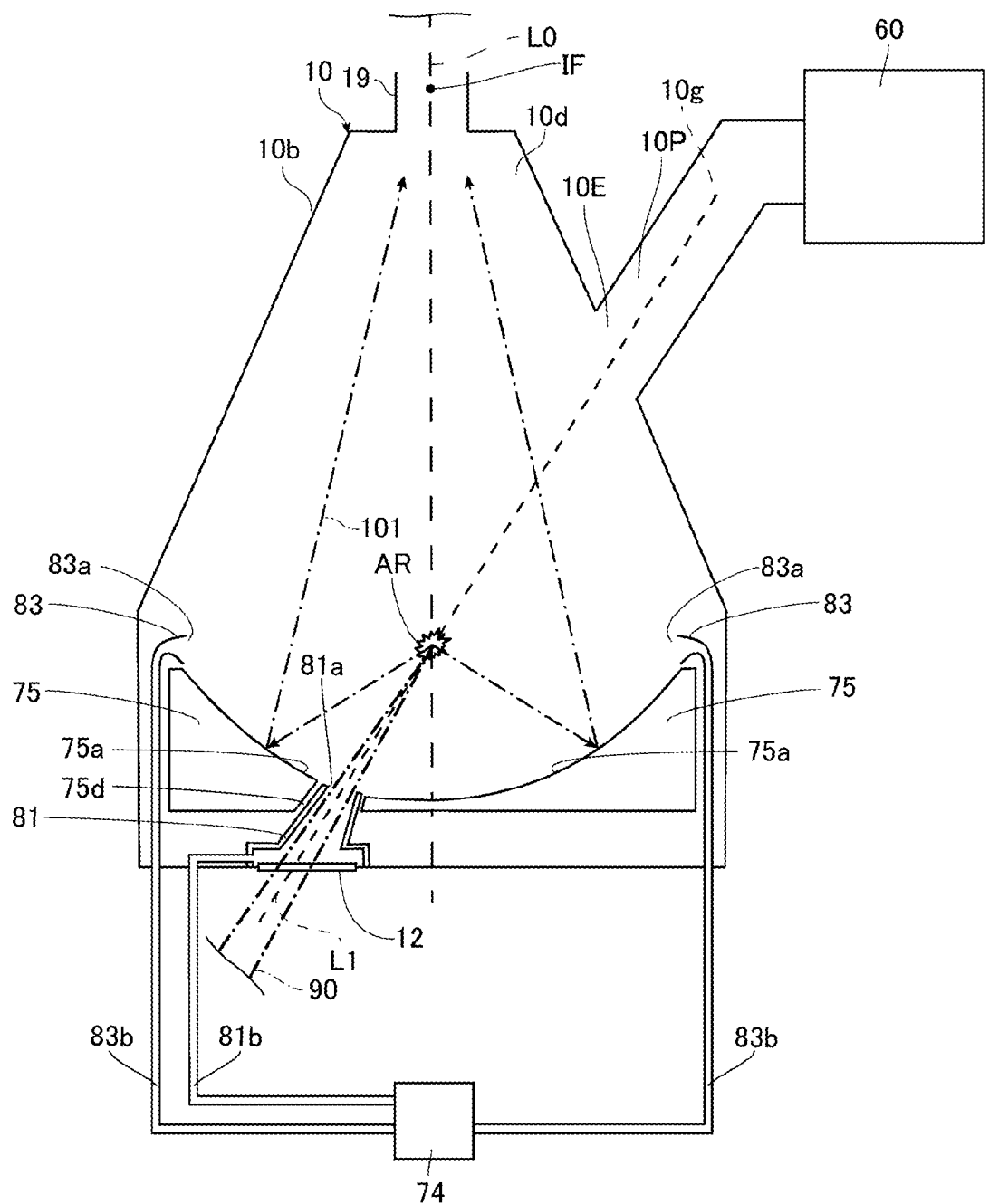
FIG. 11 is a view illustrating an exemplary schematic configuration of a part including the chamber device in Embodiment 2.
Figure 12:
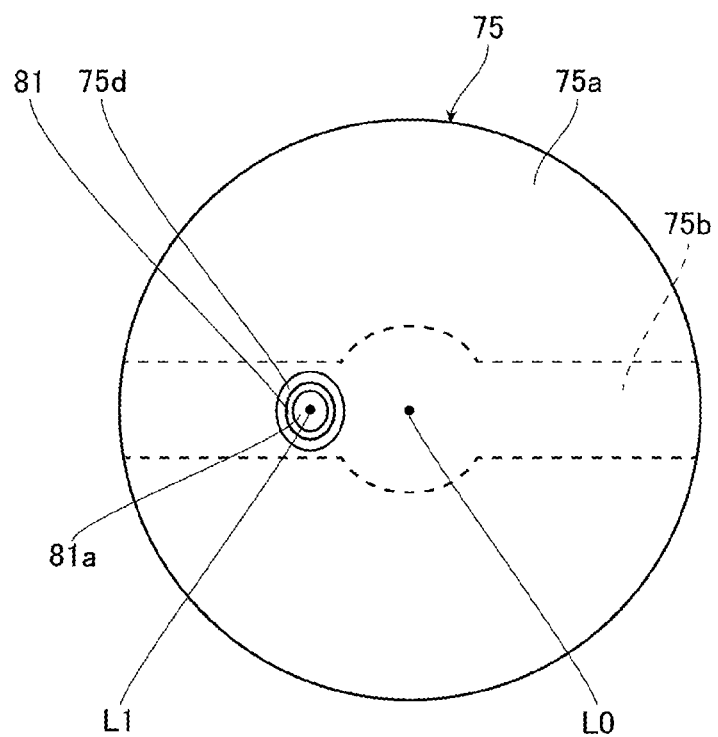
FIG. 12 is a front view of the reflection surface in Embodiment 2 when viewed from the plasma generation region side.

FIG. 11 is a view illustrating a schematic exemplary configuration of a part including the chamber device 10 in the present embodiment. FIG. 12 is a front view of the reflection surface 75a in the present embodiment when viewed from the plasma generation region AR side. In the chamber device 10 of the present embodiment, the configuration of the central gas supply unit 81 including the central gas supply port 81a is different from the configuration of the central gas supply unit 81 including the central gas supply port 81a of the first embodiment. Specifically, the central gas supply port 81a is a gas supply port through which the etching gas is supplied to the internal space of the chamber device 10, and is also an emission port through which the laser light 90 is emitted to the internal space of the chamber device 10. Further, the central gas supply unit 81 is also an emission unit. The optical axis of the laser light 90 is located on the center axis of the central gas supply port 81a and the supply line L1. In the present embodiment, the first through hole 75c is omitted.

5.2 Effect

In the EUV light generation apparatus 100 of the present embodiment, the central gas supply port 81a is the emission port through which the laser light 90 is emitted toward the plasma generation region AR along the supply line L1 from the central gas supply port 81a. Therefore, the travel direction of the laser light 90 is the same as the supply direction of the etching gas from the central gas supply port 81a. As described above, tin fine particles are generated when the droplet DL is turned into plasma in the plasma generation region AR by being irradiated with the laser light 90. Most of the fine particles diffuse in the travel direction of the laser light 90. Specifically, most of the fine particles diffuse to the side opposite to the central gas supply port 81a in the direction along the supply line L1 with respect to the droplet DL irradiated with laser light 90. In the present embodiment, the travel direction of the laser light 90 is the same as the supply direction of the etching gas from the central gas supply port 81a. Therefore, most of the fine particles can easily flow into the exhaust port 10E together with the etching gas from the central gas supply port 81a.

Further, in the EUV light generation apparatus 100 of the present embodiment, time and effort to individually design the emission port 85a and the central gas supply port 81a can be omitted, the first through hole 75c can be omitted, and the degree of freedom of designing the EUV light concentrating mirror 75 can be improved.

Figure 13:
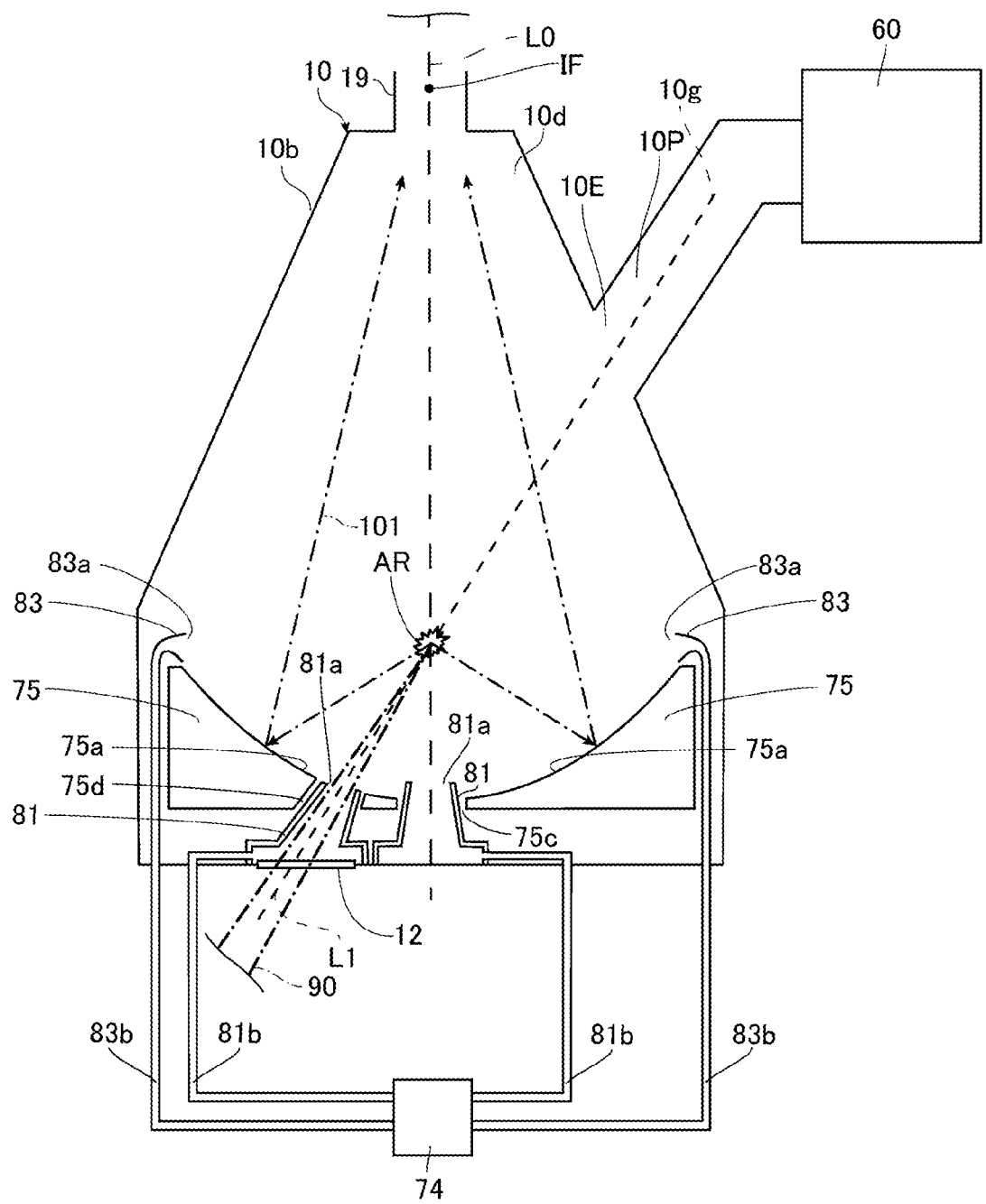
FIG. 13 is a view illustrating a modification of the central gas supply unit of Embodiment 2.

In the present embodiment, similarly to the comparative example, as illustrated in FIG. 13, the first through hole 75c, the central gas supply port 81a, and the central gas supply unit 81 may be further provided on the focal line L0, and connected to the gas supply device 74 through the pipe 81b.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined. The terms used throughout the present specification and the appended claims should be interpreted as non-limiting terms unless clearly described. For example, terms such as "comprise", "include", "have", and "contain" should not be interpreted to be exclusive of other structural elements.

Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus, comprising:
    a chamber device including a plasma generation region, at an internal space thereof, in which plasma is generated from a droplet to which laser light is radiated;
    a concentrating mirror disposed in the internal space as including a spheroidal reflection surface configured to reflect extreme ultraviolet light generated from the plasma in the plasma generation region;
    an exhaust port disposed at the chamber device and disposed on the side lateral to a focal line passing through a first focal point and a second focal point of the reflection surface on the side opposite to the reflection surface with respect to the plasma generation region; and
    a central gas supply port formed on the side opposite to the exhaust port with respect to the plasma generation region on a supply line passing through the exhaust port, the plasma generation region, and an inner side of a peripheral portion of the reflection surface,
    the central gas supply port being configured to supply gas toward the exhaust port along the supply line through the plasma generation region.

2. The extreme ultraviolet light generation apparatus according to claim 1, wherein the central gas supply port is formed in an obscuration region of the reflection surface.

3. The extreme ultraviolet light generation apparatus according to claim 1, wherein the central gas supply port is formed as facing the exhaust port.

4. The extreme ultraviolet light generation apparatus according to claim 1,
    wherein the supply line passes through the center axis of the exhaust port, the plasma generation region, and the obscuration region on the reflection surface, and
    the center axis of the central gas supply port extends on the supply line.

5. The extreme ultraviolet light generation apparatus according to claim 1, further comprising a central gas supply unit including the central gas supply port,
    wherein the central gas supply unit has a shape of a side surface of a circular truncated cone.

6. The extreme ultraviolet light generation apparatus according to claim 5, wherein the center axis of the central gas supply unit extends on the supply line.

7. The extreme ultraviolet light generation apparatus according to claim 1, further comprising a central gas supply unit including the central gas supply port,
    wherein the central gas supply unit has a shape of a side surface of a cylinder.

8. The extreme ultraviolet light generation apparatus according to claim 7, wherein the center axis of the central gas supply unit extends on the supply line.

9. The extreme ultraviolet light generation apparatus according to claim 1, wherein flux density of the gas at the central gas supply port is $7.5 \times 10^{-3}$ (kg·m$^{-2}$·s$^{-1}$) or more and $1.5 \times 10^{-1}$ (kg·m$^{-2}$·s$^{-1}$) or less.

10. The extreme ultraviolet light generation apparatus according to claim 1, further comprising an emission port through which the laser light is emitted,
    wherein the emission port is formed separately from the central gas supply port.

11. The extreme ultraviolet light generation apparatus according to claim 10, wherein the emission port is formed in an obscuration region of the reflection surface.

12. The extreme ultraviolet light generation apparatus according to claim 11, wherein the emission port is formed on the focal line.

13. The extreme ultraviolet light generation apparatus according to claim 1, wherein the central gas supply port is an emission port through which the laser light is emitted.

14. An electronic device manufacturing method, comprising:
    generating plasma by irradiating a droplet with laser light using an extreme ultraviolet light generation apparatus;
    emitting extreme ultraviolet light generated from the plasma to an exposure apparatus; and
    exposing a photosensitive substrate to the extreme ultraviolet light in the exposure apparatus to produce an electronic device,
    the extreme ultraviolet light generation apparatus including:
    a chamber device including a plasma generation region, at an internal space thereof, in which plasma is generated from a droplet to which laser light is radiated;
    a concentrating mirror disposed in the internal space as including a spheroidal reflection surface configured to reflect extreme ultraviolet light generated from the plasma in the plasma generation region;
    an exhaust port disposed at the chamber device and disposed on the side lateral to a focal line passing through a first focal point and a second focal point of the reflection surface on the side opposite to the reflection surface with respect to the plasma generation region; and
    a central gas supply port formed on the side opposite to the exhaust port with respect to the plasma generation region on a supply line passing through the exhaust port, the plasma generation region, and an inner side of a peripheral portion of the reflection surface,
the central gas supply port being configured to supply gas toward the exhaust port along the supply line through the plasma generation region.

* * * * *